(12) United States Patent
Kuo

(10) Patent No.: US 6,407,658 B2
(45) Date of Patent: *Jun. 18, 2002

(54) METHOD AND ARRANGEMENT FOR FILTERING WITH COMMON MODE FEEDBACK FOR LOW POWER CONSUMPTION

(75) Inventor: Timothy C. Kuo, Milpitas, CA (US)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/311,447

(22) Filed: May 14, 1999

(51) Int. Cl.$^7$ .............................. H03B 1/00; H03K 5/00; H04B 1/10

(52) U.S. Cl. ........................ 337/552; 327/345; 327/77; 330/258

(58) Field of Search ................................ 327/551–554, 327/311–313, 316, 318, 323, 327, 328, 77–78, 93–96, 336, 337, 345, 307; 330/258, 303, 253, 254, 260, 261

(56) References Cited

U.S. PATENT DOCUMENTS

| | | | | |
|---|---|---|---|---|
| 4,714,895 A | * | 12/1987 | Nicollini et al. ............ | 330/258 |
| 4,823,092 A | | 4/1989 | Pennock ..................... | 330/253 |
| 5,006,817 A | * | 4/1991 | Babanezhad ................ | 330/258 |
| 5,015,966 A | | 5/1991 | McIntyre .................... | 330/253 |
| 5,047,663 A | * | 9/1991 | Lee et al. ..................... | 327/77 |
| 5,166,635 A | * | 11/1992 | Shih ............................ | 330/258 |
| 5,392,003 A | | 2/1995 | Nag et al. .................... | 330/254 |
| 5,457,426 A | | 10/1995 | Brehmer ..................... | 330/253 |
| 5,465,072 A | * | 11/1995 | Atarodi ....................... | 330/258 |
| 5,764,100 A | * | 6/1998 | Callicotte et al. ........... | 327/552 |
| 5,945,874 A | * | 8/1999 | Punzenberger et al. ..... | 327/552 |
| 5,973,518 A | * | 10/1999 | Vallancourt .................. | 327/94 |
| 5,973,537 A | * | 10/1999 | Baschirotto et al. ........ | 327/337 |
| 5,982,205 A | * | 11/1999 | Vallancourt .................. | 327/94 |
| 6,020,769 A | * | 2/2000 | Vallancourt .................. | 327/94 |
| 6,069,533 A | * | 5/2000 | Kim ............................ | 330/258 |

FOREIGN PATENT DOCUMENTS

| IT | 0 493 335 A1 | 12/1991 |
|---|---|---|
| JP | 1-126811 | 11/1987 |

OTHER PUBLICATIONS

Mihai Banu et al., "Fully Differential Operational Amplifiers with Accurate Output Balancing," IEEE Journal of Solid–State Circuits, vol. 23, No. 6, Dec. 1988, pp. 1410–1414.

(List continued on next page.)

*Primary Examiner*—Terry D. Cunningham
*Assistant Examiner*—Long Nguyen
(74) *Attorney, Agent, or Firm*—Peter Zawilski

(57) ABSTRACT

Improved common mode feedback is provided in differential amplifying-type gyrator filters. One specific implementation is directed to a signal-filtering circuit arrangement, comprising a transconductance cell, and a common mode feedback circuit including MOS-based transistors arranged to minimize loading on the transconductance cell. The transconductance cell has first and second current paths, each passing current between power terminals. The common mode feedback circuit includes a high-impedance circuit configured and arranged to compare a sampled common mode voltage to a reference voltage and to provide common mode feedback to the transconductance cell with minimized loading, and further includes a signal-sampling circuit for sampling the common mode voltage of the transconductance cell using a high impedance isolation arrangement of MOS-type transistors. The above implementation is especially useful in connection with integration of such filters as part of IC applications, while providing superior filter linearity and stopband rejection.

16 Claims, 4 Drawing Sheets

OTHER PUBLICATIONS

Tat C. Choi et al., "High–Frequency CMOS Switched–Capacitor Filters for Communications Application," IEEE Journal of Solid–State Circuits, vol. SC–18, No. 6, Dec. 1983, pp. 652–664.

J. F. Duque–Carrillo et al., "A Family of Bias Circuits for High Input Swing CMOS Operational Amplifiers," 1992 IEEE International Symposium on Circuits and Systems, Sheraton Hotel, San Diego, California, May 10–13, 1992, Vol. 6 of 6, pp. 3021–3024.

Venugopal Gopinathan et al., "Design Considerations for High–Frequency Continous–Time Filters and Implementation of an Antialiasing Filter for Digital Video," IEEE Journal of Solid–State Circuits, vol. 25, No. 6, Dec. 1990, pp. 1368–1378.

Venugopal Gopinathan et al., "A 5V $7^{th}$–order Elliptic Analog Filter for Digital Video Applications," 1990 IEEE International Solid–State Circuits Conference, Feb. 16, 1990, Continental Ballroom, Session 12.

K. Halonen et al., "A 3V gmC–Filter with On–Chip Tuning for CDMA," CICC'97 Conf., San Diego, CA, 1997, pp. 83–86.

J. Haspeslagh and W. Sansen, "Design Techniques for Fully Differential Amplifiers," IEEE 1988 Custom Integrated Circuits Conference, pp. 12.2.1–12.2.4.

G. M. Jacobs et al., Design Techniques for MOS Switched Capacitor Ladder Filters, IEEE Trans. Circuits System, vol. CAS–25, No. 12, Dec. 1978.

H. Khorramabadi et al., "Baseband Filters for IS–95 CDMA Receiver Applications Featureing Digital Automatic Frequency Tuning," ISSCC'96 Conf., San Francisco, CA, Feb. 1996, pp. 172–173.

F. Krummenacher and G. Van Ruymekke, "Integrated Selectivity for Narrow–Band FM IF Systems," IEEE Journal of Solid–State Circuits, vol. 25, No. 3, Jun. 1990, Special Correspondence, pp. 757–760.

Yun–Ti Wang and Asad A. Abidi, "CMOS Active Filter Design at Very High Frequencies," IEEE Journal of Solid–State Circuits, vol. 25, No. 6, Dec. 1990, pp. 1562–1574.

\* cited by examiner-

METHOD AND ARRANGEMENT FOR FILTERING WITH COMMON MODE FEEDBACK FOR LOW POWER CONSUMPTION

RELATED PATENT DOCUMENT

The present invention being is filed concurrently with U.S. patent application Ser. No. 09/312,132, filed on May 14, 1999 which is entitled "Method and Arrangement for Gyration Filtering with Low Power Consumption" (VLSI.238PA), assigned to the instant assignee and incorporated herein by reference in its entirety.

FIELD OF THE INVENTION

The present invention relates generally to amplifiers and filters of the type involving transconductance stages that employ field effect transistors and, more particularly, to such circuits concerned with common mode feedback.

BACKGROUND OF THE INVENTION

The communications industry continues to rely upon advances in semiconductor technology to realize higher-functioning devices serving an increasingly complex communication spectrum. For many applications, realizing higher-functioning devices requires the transmission and reception of signals in potentially noisy environments. At the reception end of such communication, recovering the transmitted signal with a high degree of integrity typically requires filtering the analog signal. Preferably, this filtering occurs before significant amplification of the received signal.

Due to its low sensitivity to noise, signal filtering is often achieved using passive filters based on an LC (inductance/capacitance) ladder approach. Designing this type of passive filter, however, is problematic due to an incompatibility of integrating inductors with conventional circuit integration structures and processes. To overcome this dilemma, the conventional inductor has been replaced in many applications with an inductor-simulating electronic component called a gyrator. Gyrators are typically constructed using transistors and capacitors, each of which is fully compatible with conventional circuit integration structures and processes.

In many applications, these signal filters are also required to manifest a linear response within the bandwidth, a precisely defined stopband rejection, and, in some instances, programmability (tunability) within the bandwidth. In defining filter performance, each of these important aspects has been partially realized using Operational Transconductance Amplifiers (OTAs). OTAs are typically implemented using the gyrator design in a differential amplifier configuration. The programmability of the OTA is addressed by varying its transconductance, which is directly proportional to the bandwidth characteristics and inversely proportional to the capacitance.

For many filters requiring or benefiting from gyrators of this differential-transconductance type, precisely controlling the common mode voltage of the transconductance stages is important. This is particularly true for certain channel select filters such as the channel filter recommended in CDMA IS-95, where filter performance must comply with stringent filter linearity and stopband rejection criteria. Gyrators of this differential amplifier type provide a somewhat balanced output having a common mode voltage (or difference potential) that is a function of potentials of nodes in the vicinity of the output nodes. However, because these potentials are difficult to control, an intolerable variation of the common mode voltage can result, which in turn leads to variation in conductance value and thus variation of the cutoff frequencies. Moreover, to satisfy stringent filter linearity criteria, it is important that the operating frequency range be widely defined and not fluctuate.

These difficulties in such differential amplifier gyrator circuits have been partly overcome by common mode feedback (CMFB) implemented as part of gyrator circuits to maintain the common mode voltage within a reasonable range. In one implementation, for example, relatively balanced outputs are provided by merging the CMFB and the differential gain paths to improve the accuracy of the output balancing. For further information on this type of circuit, and related implementations, reference may be made to the following references: Tat C. Choi, et al., High-Frequency CMOS Switched-Capacitor Filters for Communications Application, IEEE Journal of Solid-State Circuits, Vol. SC-18, No. 6, 652–664, December 1983; J. Haspeslagh & W. Sansen, Design Techniques for Fully Differential Amplifiers, IEEE 1998 Custom Integrated Circuits Conference, 12.2.1–12.2.4; Venugopal Gopinathan et al., Design Considerations for High-Frequency Continuous-Time Filters and Implementation of an Antialiasing Filter for Digital Video, IEEE Journal of Solid-State Circuits, Vol. 25, No. 6, 1368–1378, December 1990; and Mihai Banu et al., Fully Differential Operational Amplifiers with Accurate Output Balancing, IEEE Journal of Solid-State Circuits, Vol. 23, No. 6, 1410–1414, December 1988. Problems remain with these conventional approaches including, for example: inadequacy in control over the common mode voltage, unduly limited CMFB bandwidths, unacceptable linearity, and the need for overly large components (e.g., resistors) that are burdensome in terms of silicon real estate and MOS-type IC processing steps.

Accordingly, there is a need for a signal-filtering approach that addresses the bandwidth linearity and stopband rejection criteria required by an increasing number of applications and that overcomes the above-mentioned problems of the prior art.

SUMMARY

According to various aspects of the present invention, embodiments thereof are exemplified in the form of methods and arrangements for improving common mode feedback (CMFB) in differential amplifying-type filters. Such embodiments are useful in connection with integration of such filters as part of IC applications, while providing superior filter linearity and stopband rejection.

One specific implementation is directed to a signal-filtering circuit arrangement, comprising a transconductance cell, and a common mode feedback circuit including MOS-based transistors arranged to minimize loading on the transconductance cell. The transconductance cell has first and second current paths, each passing current between power terminals. The common mode feedback circuit includes a high-impedance circuit configured and arranged to compare a sampled common mode voltage to a reference voltage and to provide common mode feedback to the transconductance cell with minimized loading, and further includes a signal-sampling circuit for sampling the common mode voltage of the transconductance cell using a high impedance isolation arrangement of MOS-type transistors.

In another specific example implementation, the present invention is directed to a signal-filtering circuit arrangement comprising a transconductance cell having two pairs of current paths passing current from a power source terminal to a power drain terminal. One of the pairs of current paths is coupled to a differential input port, and another of the pairs of current paths is coupled to a differential output port. The signal-filtering circuit further includes a common mode feedback circuit including a high-impedance circuit and a signal-sampling circuit. The signal-sampling circuit samples a common mode voltage of the transconductance cell at the differential output port using a high impedance isolation arrangement of MOS-type transistors and provides a sampled common mode voltage for driving an input port of the high-impedance circuit. The high-impedance circuit compares the sampled common mode voltage to a reference voltage and provides a common mode feedback to the transconductance cell. More specific example implementations are directed to this same type of signal filtering circuit with following additional aspects: the high-impedance circuit is implemented using NMOS transistors; the high-impedance isolation arrangement of MOS-type transistors is implemented using a source follower arrangement and using a pair of MOS transistors interconnected at a node that is adapted to provide the common mode feedback to the transconductance cell; the transconductance cell includes a common mode feedback input port adapted to control the current paths coupled to the differential output port; the transconductance cell includes a common mode feedback input port adapted to control the current paths coupled to the differential output port; and wherein the signal signaling circuit further includes a plurality of transconductance cells arranged consistent with the above-characterized transconductance cell and with common mode feedback being provided consistent with the above-characterized common mode feedback.

The above summary is not intended to provide an overview of all aspects of the present invention. Other aspects of the present invention are directed to alternative arrangements and methods, as are exemplified and described in connection with the detailed description.

BRIEF DESCRIPTION OF THE DRAWINGS

Various aspects and advantages of the present invention will become apparent upon reading the following detailed description of various embodiments and upon reference to the drawings in which.

Figure 1:
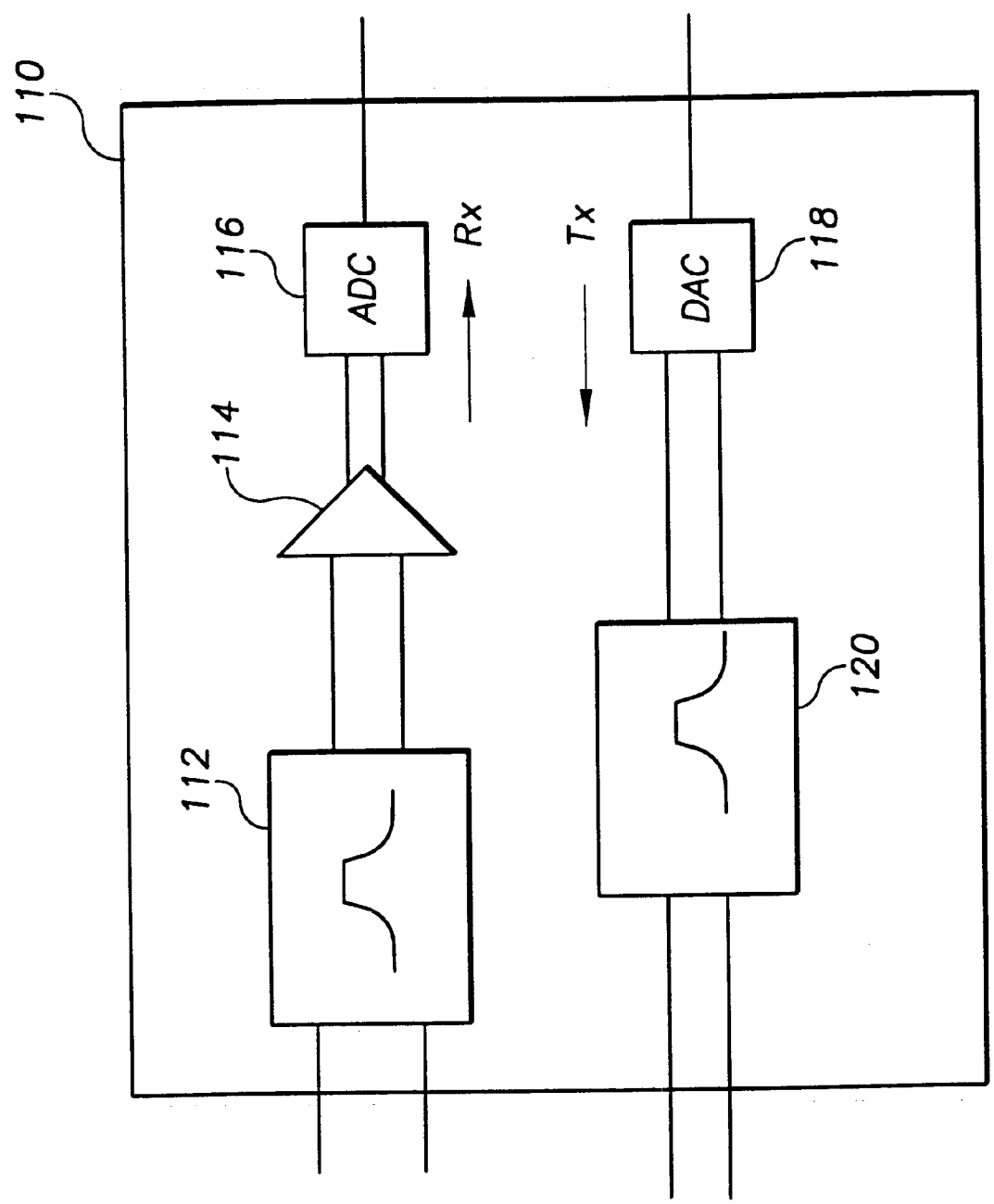
FIG. 1 illustrates a signal-filtering circuit arrangement as part of an integrated circuit design, according to an example application and embodiment of the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention is believed to be applicable to a variety of amplifiers and filters of the type involving transconductance stages. Embodiments of the present invention are believed to be particularly advantageous in integrated circuit (IC) designs involving MOS-type transistors; however, the invention is also thought to be applicable to other similar technologies, including but not exclusively field effect transistor types. While the present invention is not necessarily so limited, an appreciation of the invention may be obtained through a discussion of one or more example applications in such environments.

In one example application, the present invention is directed generally to a channel select filter'such as the channel filter recommended in CDMA IS-95, having stringent filter linearity and stopband rejection criteria, and is directed specifically to the implementation of an Operational Transconductance Amplifier (OTA) circuit used in such a channel select filter. For details concerning the filter linearity and stopband rejection criteria, reference may be made to the IS95 and IS98 CDMA recommendations for digital cellular communications.

FIG. 1 illustrates an example embodiment of such a channel select filter in an integrated circuit (IC) chip 110 adapted for the type of cellular application mentioned above. The IC chip 110 of FIG. 1 is shown to include a receive path along the upper portion and a transmit path along the lower portion of the IC chip 110. The circuitry blocks depicted in the receive path include a signal filter 112 arranged as a lowpass filter, an amplifier 114, and an analog-to-digital converter (ADC) 116. The signal filter 112 is used as the above-mentioned channel select filter in the example application, for passing signals in the applicable cellular frequency band selected by the particular design of the signal filter 112. The input signal received by the signal filter 112, in one particular implementation, is provided by an intermediate frequency (IF) demodulator (not shown). The signal filter 112, designed in accordance with the present invention, passes signals in the applicable frequency band with adequately precise linearity and stopband rejection to satisfy the requirements set forth in the above-referenced CDMA IS-95 and IS-98 recommendations. The amplifier 114 amplifies the filter 112, as is conventional, and the ADC 116 converts these signals to digital form for subsequent signal processing by a signal processor arrangement (not shown).

The circuitry blocks depicted in the transmit path include a conventional digital-to-analog converter (DAC) 118, adapted to convert digital signals provided by the signal processor arrangement into analog form for transmission, and a signal filter 120. The signal filter 120 is also arranged as a lowpass filter and can be constructed in the same manner as the signal filter 112 for passing signals in the applicable cellular frequency band selected by the particular design of the signal filter 112. The signal filter 112 passes the filtered signals to the IF modulator mentioned above.

Figures 1, 2:
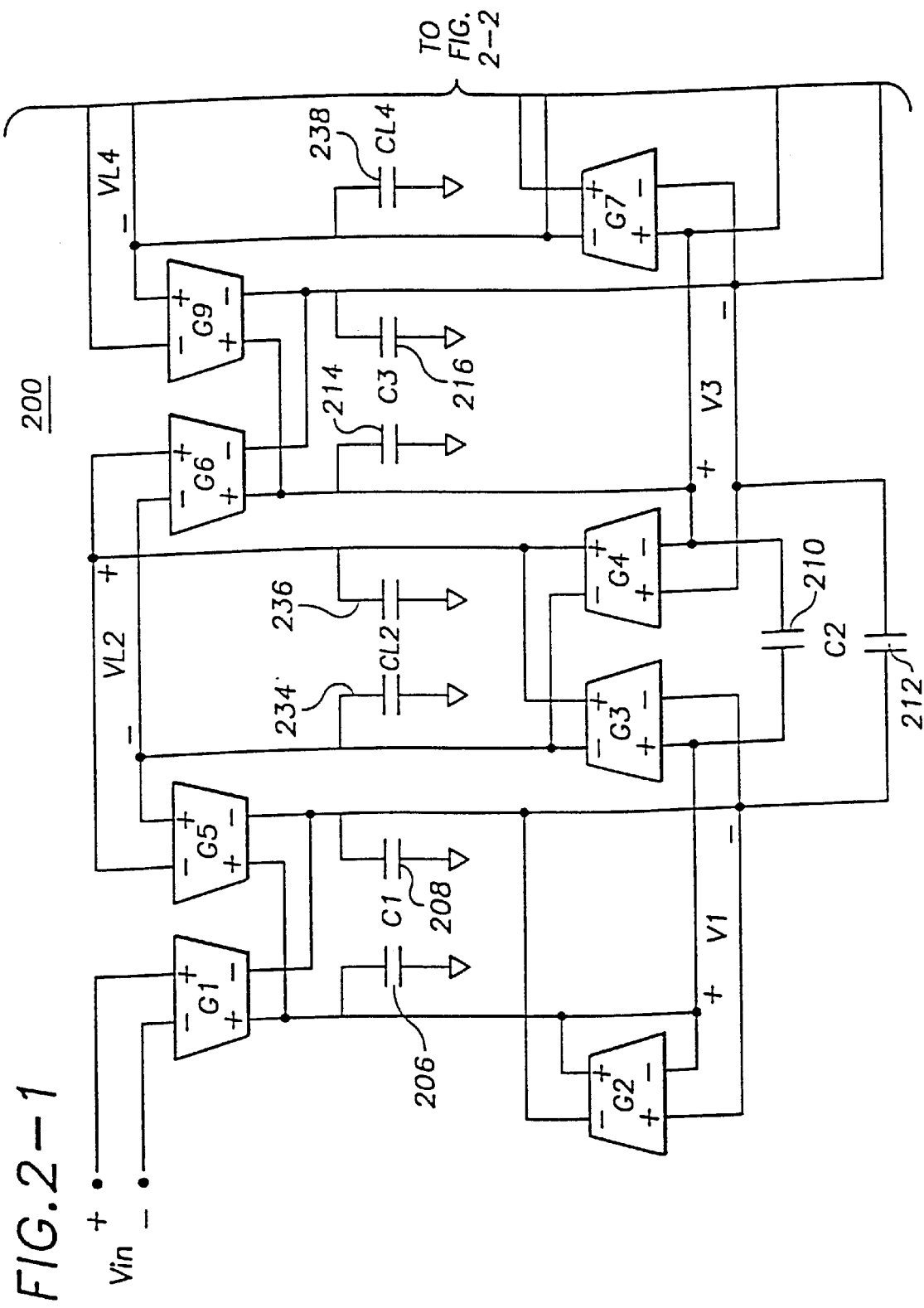
FIG. 2 illustrates an example circuit of the signal-filtering circuit arrangement of FIG. 1 and according to a more specific example application and example embodiment of the present invention.
Figure 2:
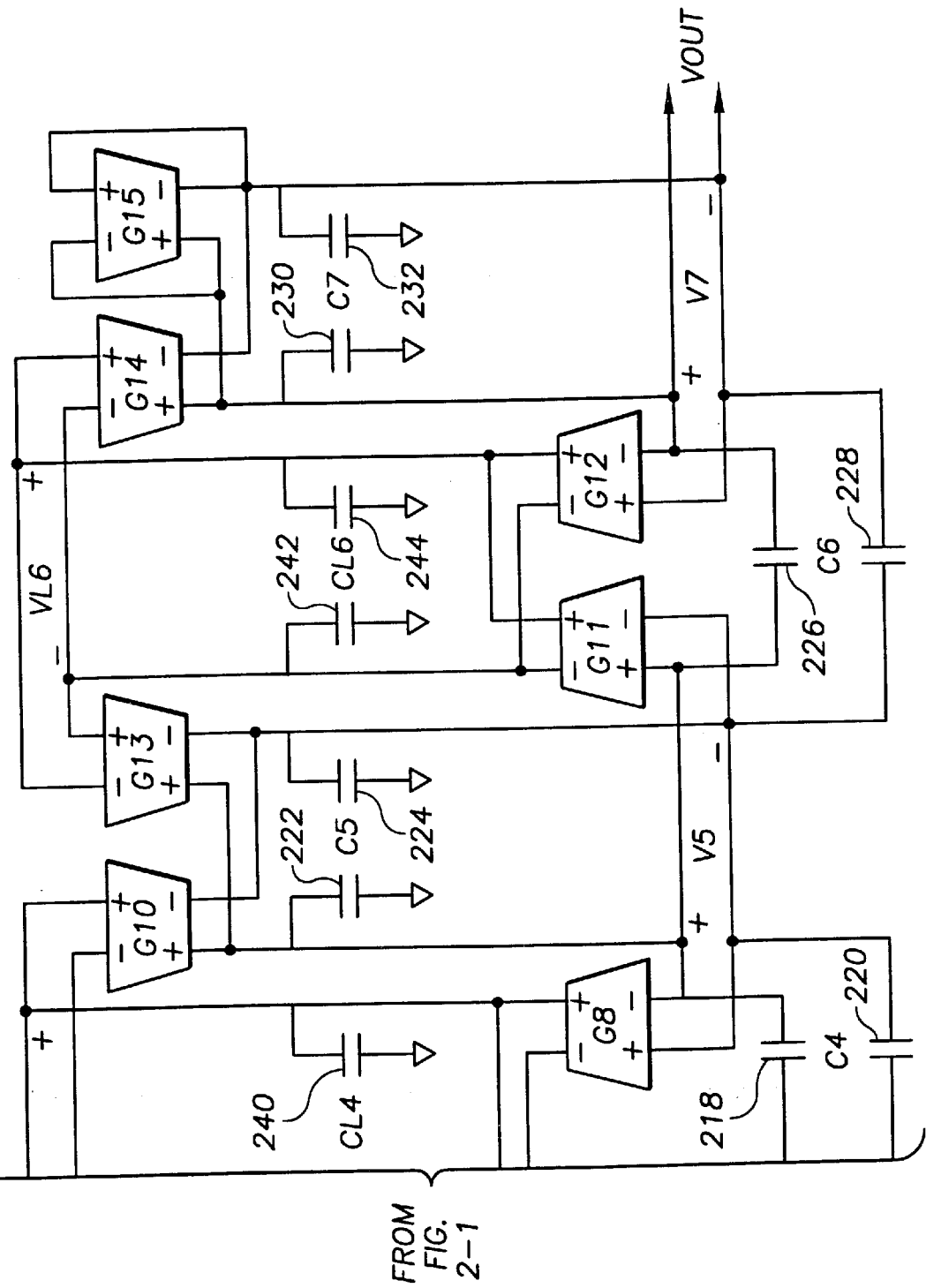

As discussed above, signal filtering is often achieved using passive filters based on an LC ladder approach. To overcome problems relating to incompatibility of integrating inductors with conventional circuit integration structures and processes, it is useful to implement the inductance element using an inductor-simulating gyrator, which is fully compatible with conventional circuit integration structures and processes. FIG. 2 illustrates an example gyrator-based signal filter 200, for an LC ladder implementation of the signal-filter 112 and/or 120 of FIG. 1, according to the present invention.

In the example arrangement illustrated, the gyrator-based signal-filter 200 includes a plurality of transconductance cells G1–G15, and a plurality of capacitors C1–C7 and CL2, CL4 and CL6, as depicted by respective reference numerals 206, 206 (C1), 210, 212 (c2), 214, 216 (C3), 218, 220 (C4), 222, 224 (C5), 226, 228 (C6), 230, 232 (C7, 234, 236 (CL2), 238, 240 (CL4), and 242, 244 (CL6). The gyrator-based signal-filter 200 implements an LC ladder filter with three inductors represented by three gyrator-capacitor arrangements. For example, $G_3$, $G_4$, $G_5$, $G_6$ together with $C_{L2}$ form an inductor with its value given by the formula: $L_2 = C_{L2}/gm^2$, where gm is the transconductance value of $G_3$–$G_6$. Similarly, $L_4 = C_{L4}/gm^2$ and $L_6 = C_{L6}/gm^2$.

In one particular conventional approach, all the transconductors have same transconductance value, gm. Thus, the filter impedance level is 1/gm. The actual element value is scaled by the impedance level as well as by the filter cutoff frequency $f_0$. In other words, the actual inductor value $L_{2,4,6} = L_{20,40,60}/(gm*2 \partial f_0)$, where $L_{20,40,60}$ are the normalized inductor values from the standard filter design table. By applying the equation given above, the following component value is determined as: $C_{L2, L4, L6} = (gm*L_{20,40,60})/(2 \partial f0)$, where $C_{10-70}$ are the normalized capacitor values from the standard filter design table.

The following summarizes the conventional design equations for implementing the gyrator filter:

$$G_1 - G_{15} = gm$$

$$C_1, C_3, C_5, C_7 = \frac{C_{i0} * gm}{2\pi f_0}$$

$$C_2, C_4, C_6 = \frac{C_{i0} * gm}{2\pi f_0}$$

$$C_{L2}, C_{L4}, C_{L6} = \frac{L_{i0} * gm}{2\pi f_0}$$

where gm is the transconductance value, $f_0$ is the filter cutoff frequency, $C_1$ is the actual capacitor value implemented, and $C_{i0}$, $L_{i0}$ is the normalized element value from standard filter table.

For additional information concerning particular implementations corresponding to the gyrator-based signal-filter 200 illustrated in FIG. 2, and related alternative gyrator-based implementations, reference may be made to the above-referenced U.S. Patent Document identified by Application Ser. No. 09/312,132 and to the following articles: H. Khorramabadi, M. J. Tarsia, N. Woo, Baseband Filters for IS-95 CDMA Receiver Applications Featuring Digital Automatic Frequency Tuning, ISSCC'96 Conf., San Francisco, Calif., February 1996, pp. 172–173; K. Halonen, S. Lindfors, J. Jussila, L. Siren, A 3V gmC-Filter with On-Chip Tuning for CDAM, CICC'97 Conf., San Diego, Calif., 1997, pp. 83–86; and G. M. Jacobs, D. J. Allstot, P. R. Gray, Design Techniques for MOS Switched Capacitor Ladder Filters, IEEE Trans. Circuits System, Vol. CAS-25, No. 12, December 1978.

For the gyrator-based signal-filters such as the gyrator-based signal-filter 200 of FIG. 2 and the alternative embodiments mentioned in the above-cited articles, according to the present invention, control of the common mode voltage of the gyrator (or transconductance cell) significantly improves filter linearity and stopband rejection. In particular embodiments, this is accomplished by sampling the common mode voltage while minimizing loading of the transconductance cell. This can be best understood by referring to the example transconductance cell of FIG. 3, which has differential input and output sets that map directly to each of the differential input and output sets of the gyrators G1–G15 of FIG. 2.

Figure 3:
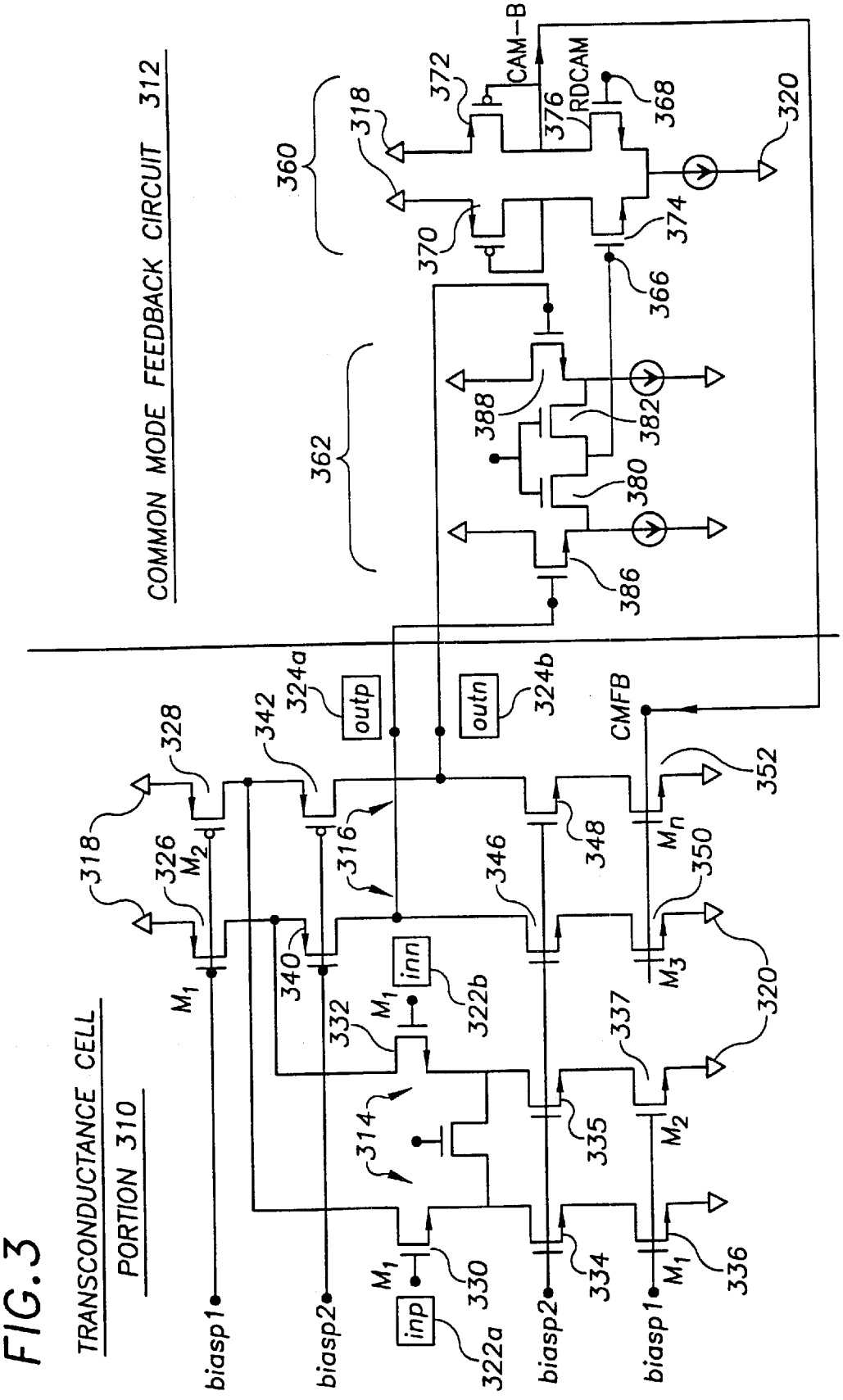
FIG. 3 illustrates an example circuit arrangement including a transconductance cell with common mode feedback for implementing a portion of the signal-filtering circuit arrangement illustrated in FIGS. 1 and 2, according to another aspect of the present invention.

The example transconductance cell of FIG. 3 includes a transconductance cell portion 310 and a common mode feedback circuit 312. The transconductance cell portion 310 has two pairs of current paths 314 and 316 passing current from a power source terminal 318 to a power drain terminal 320. The current paths 314 and 316 respectively provide a differential input port at terminals 322a (positive) and 322b (negative), and a differential output port at terminals 324a (positive) and 324b (negative). The current paths 314 and 316 share PMOS transistors 326 and 328, which are respectively biased at a selected voltage for the particular application and design, as is conventional. The current path 314 further includes: NMOS transistors 330 and 332 having their respective gates driven by the differential input signals, and NMOS transistors 334–337 having their respective gates biased at other selected voltages, as above for the transistors 326 and 328. An NMOS transistor 338 is used to control the transconductance value by varying the gate voltage Vc. The current path 316 further includes: PMOS transistors 340 and 342 having their respective gates driven by a particularly selected voltage, NMOS transistors 346 and 348 having their respective gates biased at the same selected voltage as the gates of NMOS transistors 334 and 335, and NMOS transistors 350–352 having their respective gates controlled at a voltage selected by the common mode feedback circuit 312.

The common mode feedback circuit 312 includes a high-impedance circuit 360 and a signal-sampling circuit 362. The signal-sampling circuit 362 is constructed to sample the common mode voltage of the transconductance cell which, in this instance, is obtained at the differential output port 324a and 324b. The signal-sampling circuit 362 uses a high impedance isolation arrangement of MOS-type transistors and provides a sampled common mode voltage for driving an input port 366 of the high-impedance circuit 360. The high-impedance circuit is constructed to compare the sampled common mode voltage to a reference voltage at node 368 and to provide common mode feedback to the transconductance cell portion 310.

The high-impedance circuit 360 is substantially another current mirror with two diode-arranged PMOS transistors 370 and 372 passing current along respective current paths to NMOS transistors 374 and 376. The reference voltage at node 368 drives the NMOS transistor 376. The common mode feedback is provided by the high-impedance circuit 360 using the impedance-isolated nodes of its current mirror connected to the gates of the NMOS transistors 350–352 in the transconductance cell portion 310.

The signal-sampling circuit 362 is a MOS-type transistor arrangement comprising a pair of active NMOS-type transistors 380 and 382 coupled to a node that connects to and drives the high-impedance circuit at the node 366 with the sampled common mode voltage. The gates of the NMOS-type transistors 380 and 382 are interconnected and set at a voltage selected to provide that these NMOS transistors operate in the linear region as does a resistor. The degree of linearity increases with the voltage level controlling the gates of the transistors 380 and 382. The other respective terminals of the NMOS-type transistors 380 and 382 are driven by first and second source followers, transistors 386 and 388, to provide minimal loading effects on the output port 324a and 324b of the transconductance cell portion 310.

The various embodiments described above are provided by way of illustration only and are not intended to limit the invention. Those skilled in the art will readily recognize various modifications and changes that may be made to the present invention. For example, the skilled artisan will appreciate that: other polarities and types of transistors can be designed to provide functionality similar to that discussed above; alternative transconductance cells can also be used in combination with a similarly-constructed common mode feedback circuit, and the common mode feedback circuit 312 can be altered by using a modified a signal-sampling circuit 362 and/or a modified high-impedance circuit 360. While these and other alterations may not strictly follow the example embodiments and applications illustrated and described herein, the scope of the present invention is set forth in the following claims.

What is claimed is:

1. A signal-filtering circuit arrangement, comprising:
   a transconductance cell having input and output ports and first and second current paths passing current through a current-mirror circuit from a power source terminal to a power drain terminal; and
   a common mode feedback circuit within the transconductance cell and including a signal-sampling circuit configured and arranged to sample a common mode voltage at the transconductance cell and to provide a sampled common mode voltage, and including a comparison circuit configured and arranged to compare the sampled common mode voltage to a reference voltage and to provide common mode feedback to the transconductance cell.

2. The signal-filtering circuit arrangement of claim 1, wherein the signal-sampling circuit includes a high impedance isolation arrangement of MOS-type transistors to sample the common mode voltage at the transconductance cell.

3. The signal-filtering circuit arrangement of claim 2, wherein the MOS-type transistors of the signal-sampling circuit are implemented using a source-follower arrangement.

4. The signal-filtering circuit arrangement of claim 3, wherein the output ports of the transconductance cell are connected to the high impedance isolation arrangement of MOS-type transistors.

5. The signal-filtering circuit arrangement of claim 4, wherein the output ports of the trantsconductance cell are current-mirrored ports.

6. The signal-filtering circuit arrangement of claim 1, wherein the output ports of the transconductance cell are connected to the high impedance isolation arrangement of MOS-type transistors.

7. The signal-filtering circuit arrangement of claim 6, wherein the output ports of the transconductance cell are current-mirrored ports.

8. The signal-filtering circuit arrangement of claim 1, wherein the comparison circuit includes a high impedance isolation arrangement of MOS-type transistors to compare the common mode voltage to the reference voltage.

9. The signal-filtering circuit arrangement of claim 1, wherein the comparison circuit includes a high impedance isolation arrangement of MOS-type transistors to compare the common mode voltage to the reference voltage, the MOS-type transistors of the comparison circuit being interconnected at a node that is adapted to provide the common mode feedback to the transconductance cell.

10. The signal-filtering circuit arrangement of claim 1, wherein the signal-sampling circuit includes a source-follower arrangement of MOS-type transistors to electrically couple to the output ports for sampling the common mode voltage at the transconductance cell.

11. The signal-filtering circuit arrangement of claim 10, wherein the comparison circuit includes a MOS-type transistor responsive to the reference voltage, and wherein the reference voltage is set at a selected common mode voltage threshold.

12. The signal-filtering circuit arrangement of claim 1, wherein the signal-sampling circuit includes an arrangement of MOS-type transistors to electrically couple to the output ports for sampling the common mode voltage at the transconductance cell, and wherein the MOS-type transistors are adapted to operate in the linear region to provide the sampled common mode voltage.

13. The signal-filtering circuit arrangement of claim 1, wherein the signal-sampling circuit includes a source-follower arrangement of MOS-type transistors to electrically couple to the output ports for sampling the common mode voltage at the transconductance cell, and wherein the MOS-type transistors are adapted to operate in the linear region to provide the sampled common mode voltage.

14. The signal-filtering circuit of claim 1, further including at least one additional transconductance cell and for each additional transconductance cell, further including an additional common mode feedback circuit, each of the transconductance cells being similarly arranged and each of the common mode feedback circuits being similarly arranged.

15. signal-filtering circuit arrangement, comprising:
   a transconductance cell having input and output ports and first and second current paths passing current through a current-mirror circuit from a power source terminal to a power drain terminal; and
   a common mode feedback circuit within the transconductance cell and including means for sampling a common mode voltage at the transconductance cell and for providing a sampled common mode voltage, and including means for comparing the sampled common mode voltage to a reference voltage and providing common mode feedback to the transconductance cell.

16. A signal-filtering circuit arrangement, comprising:
   a plurality of interconnected transconductance cell, each of the transconductance cells having input and output ports and first and second current paths passing current through a current-mirror circuit from a power source terminal to a power drain terminal; and
   a plurality of common mode feedback circuits, each of the common mode feedback circuits within a respective one of the transconductance cells and including high-input impedance means for sampling a common mode voltage at the respective transconductance cell and for providing a sampled common mode voltage, and including means for comparing the sampled common mode voltage to a reference voltage and providing common mode feedback to the respective transconductance cell.

* * * * *